(12) United States Patent
Zipper

(10) Patent No.: US 7,236,753 B2
(45) Date of Patent: Jun. 26, 2007

(54) DIRECT OUTPHASING MODULATOR

(75) Inventor: Eliav Zipper, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 444 days.

(21) Appl. No.: 10/745,627

(22) Filed: Dec. 29, 2003

(65) Prior Publication Data

US 2005/0148307 A1 Jul. 7, 2005

(51) Int. Cl.
*H04B 1/04* (2006.01)
(52) U.S. Cl. .................. 455/102; 455/103; 455/126
(58) Field of Classification Search ............... 455/126, 455/127.1, 127.2, 102, 103, 118; 375/295; 332/144–145
See application file for complete search history.

(56) References Cited

U.S. PATENT DOCUMENTS

| | | | | |
|---|---|---|---|---|
| 6,049,255 | A * | 4/2000 | Hagberg et al. | 331/17 |
| 6,201,452 | B1 * | 3/2001 | Dent et al. | 332/103 |
| 6,369,651 | B1 * | 4/2002 | Dent | 330/127 |
| 6,587,511 | B2 * | 7/2003 | Barak et al. | 375/295 |
| 6,593,827 | B2 * | 7/2003 | Chethik et al. | 332/103 |
| 6,799,020 | B1 * | 9/2004 | Heidmann et al. | 455/103 |
| 2002/0027958 | A1 * | 3/2002 | Kolanek | 375/297 |
| 2003/0125065 | A1 * | 7/2003 | Barak et al. | 455/522 |
| 2004/0204100 | A1 * | 10/2004 | Braithwaite | 455/561 |
| 2004/0266368 | A1 * | 12/2004 | Rosnell | 455/110 |
| 2005/0136864 | A1 * | 6/2005 | Zipper | 455/127.1 |
| 2005/0215206 | A1 * | 9/2005 | Granstrom et al. | 455/102 |
| 2005/0275481 | A1 * | 12/2005 | Grewing et al. | 332/127 |

FOREIGN PATENT DOCUMENTS

DE WO 03/079536 A2 * 9/2003
JP 09074320 A * 3/1997

OTHER PUBLICATIONS

U.S. Appl. No. 10/603,860, filed Jun. 26, 2003, Hasson et al.

* cited by examiner

*Primary Examiner*—Nguyen T. Vo
(74) *Attorney, Agent, or Firm*—Pearl Cohen Zedek Latzer LLP

(57) ABSTRACT

Embodiments of the invention describe a modulator having first and second synthesizers, for example, fractional-N synthesizers, that generate first and second outphased modulated signals with aligned phases. Embodiments of the modulator may align the phases of the outphased signals using first and second feedback loops associated with first and second modulation paths of the modulator.

17 Claims, 3 Drawing Sheets

DIRECT OUTPHASING MODULATOR

BACKGROUND OF THE INVENTION

Mobile Stations (MS), handheld devices, Base Stations (BS), Access Points (AP) and other devices of wireless communication systems may include transmitters to transmit Radio Frequency (RF) signals. The transmitters may be linear transmitters, outphasing transmitters, and the like. Transmitters that are used to transmit continuous phase modulation signals, such as, for example, Gaussian Minimum Shift Keying (GMSK) signals, and the like, may combine a linear amplification technique using non-linear components (LINC) with direct modulation through one or more modulation paths that may include fractional-N synthesizers with built in data modulators and power amplifiers. Combination of the modulated, amplified signals may be implemented by a quarter wave combiner, Wilkinson combiner, reactive termination combiner and the like. Alignment of the phases of the amplified outputs to be combined may be important because even minor phase misalignment may lead to reduced efficiency of the transmitter, and may also result in a non-monotonic response that may degrade a desired linearity of the modulation process.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
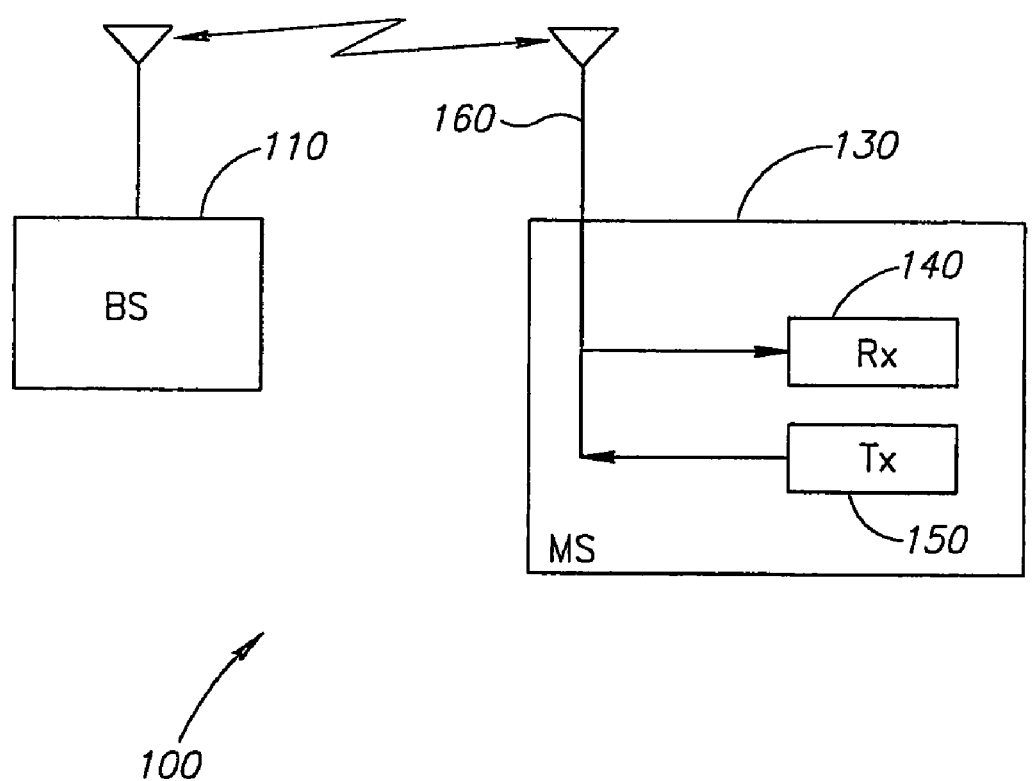
FIG. 1 is a schematic illustration of a wireless communication system that may be used in conjunction with a transmitter according to an exemplary embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

Some portions of the detailed description, which follow, may be presented in terms of algorithms and symbolic representations of operations on data bits or binary digital signals within a computer memory. These algorithmic descriptions and representations may be the techniques used by those skilled in the art of data processing to convey the substance of their work to others skilled in the art.

Unless specifically stated otherwise, as apparent from the following discussions, it is appreciated that throughout the specification, discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

It should be understood that the present invention may be used in a variety of applications. Although the present invention is not limited in this respect, the circuits and techniques disclosed herein may be used in many apparatuses such as receivers of a radio system. Receivers intended to be included within the scope of the present invention include, by way of example only, wireless local area network (WLAN) receivers, two-way radio receivers, digital system receivers, analog system receivers, cellular radiotelephone receivers and the like.

Types of cellular radiotelephone transmitters intended to be within the scope of the present invention include, although are not limited to, Code Division Multiple Access (CDMA) and wide band CDMA (W-CDMA) cellular radiotelephone transmitters for transmitting spread spectrum signals, Global System for Mobile communication (GSM) cellular radiotelephone transmitters, Time Division Multiple Access (TDMA) transmitters, Extended-TDMA (E-TDMA), General Packet Radio Service (GPRS), Extended GPRS transmitters for transmitting amplitude modulated (AM) and phase modulated signals, and the like.

Turning to FIG. 1, a wireless communication system 100, for example, a cellular communication system is shown. Although the scope of the present invention is not limited in this respect, the exemplary cellular communication system 100 may include at least one base station (BS) 110 and at least one mobile station (MS) 130. Mobile station 130 may include a receiver 140, a transmitter 150, and an antenna 160, for example, an omni-directional antenna, a highly-directional antenna, a steerable antenna, a dipole antenna, and the like.

In some embodiments of the present invention, transmitter 150 may include a universal transmitter architecture to support digital data transmission. Although the scope of the present invention is not limited in this respect, the universal transmitter architecture may combine a linear amplification technique using non-linear components (LINC) with direct modulation through one or more fractional-N (FN) synthesizers. In some embodiments of the invention, one or more sets of a fractional-N synthesizer with a sigma-delta modulator may provide a desired transmission frequency deviation around a desired carrier frequency, for example, by dithering between a predetermined number of divider values of a divider in the FN synthesizer. For example, in some exemplary embodiments, the desired deviation may be achieved, e.g., by controlling the density of appearance of "+1" and/or "−1" signals according to an offset value related to the desired transmission frequency, if desired. Although the scope of the present invention is not limited in this respect, the sigma-delta modulators may provide such "+1" and/or "−1" signals with a digital word. The digital word may include one or more bits. In embodiments of the present invention, the sigma-delta modulators may be implemented by hardware, by software, or by any suitable combination of hardware and/or software.

Figure 2:
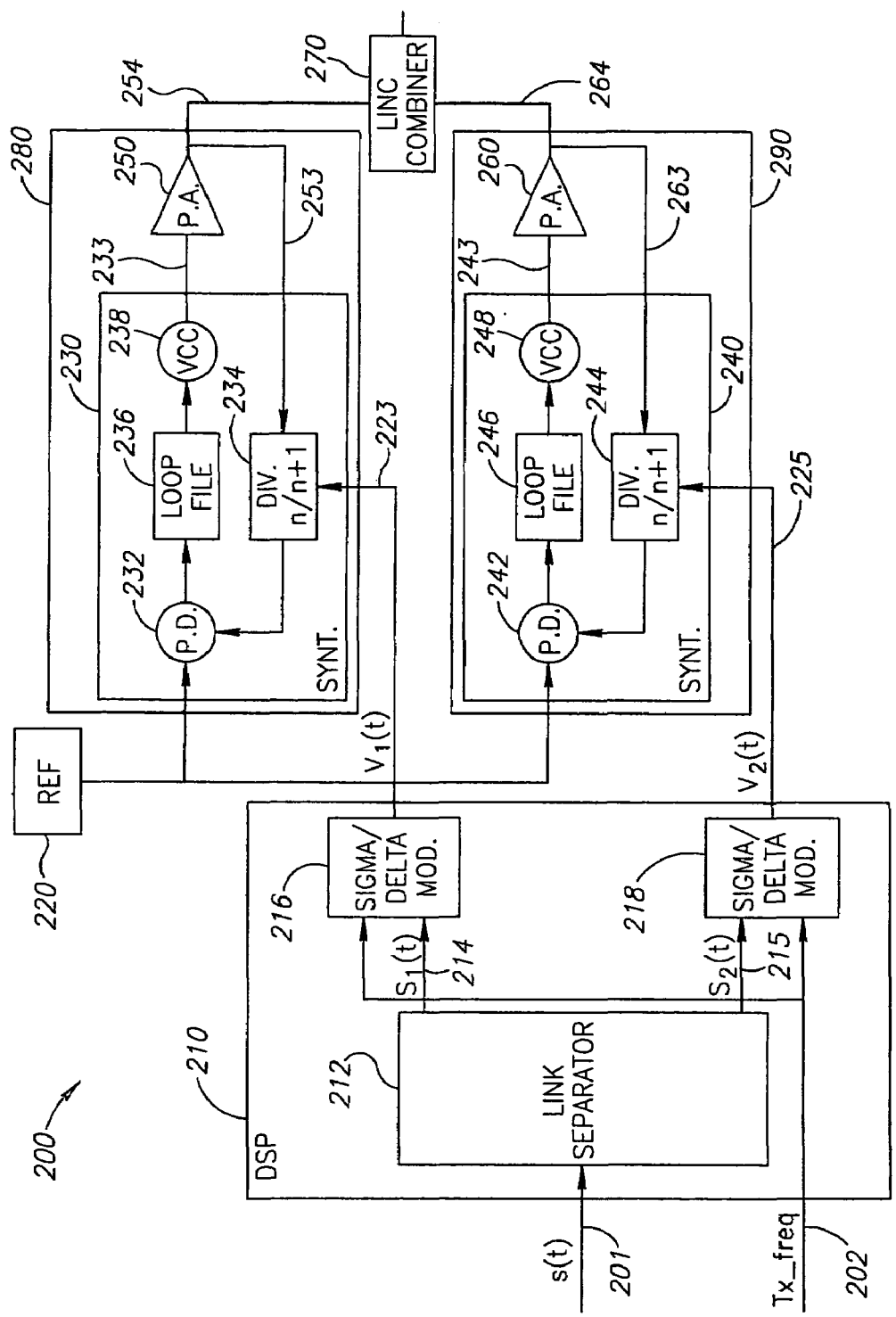
FIG. 2 is a block diagram of a transmitter according to an exemplary embodiment of the present invention.

Turning to FIG. 2, a block diagram of a transmitter 200 according to an exemplary embodiment of the present invention is shown. Although the scope of the present invention is not limited in this respect, transmitter 200 may include a digital signal processor (DSP) 210, a reference oscillator 220, synthesizers 230, 240, power amplifiers 250, 260 and a combiner 270.

Although the scope of the present invention is not limited in this respect, an input signal 201, denoted s(t), may be provided to transmitter 200. For example, input signal 201 may be an analog signal or a digital signal and may be described as follows:

$$s(t) = A(t)\cos\left[w_c t + D_f \int_{-\infty}^{t} m(\tau) d\tau\right]$$

wherein:
A(t) may represent the transmitted amplitude;
$w_c$ may be the transmitted frequency;
$D_f$ may be the deviation index; and
m(t) may represent the baseband digital signal.

In some embodiments of the invention, a phase of signal s(t) may be proportional to the integral of m(t), if desired.

Although the scope of the present invention is not limited in this respect, input signal 201, for example, a variable complex base band signal, may be input to a separator 212, for example, a LINC separator or the like. Separator 212 may generate two separate constant envelope signals (not shown in the drawings) based on the instantaneous amplitude of the input signal. The two envelope signals may be shifted in phase, for example, the phase of a first signal 214 may be 0 degrees and the phase of a second signal 215 may be 90 degrees, if desired. As an example, the constant envelope signals may be depicted as follows:

$$s_1(t) = \frac{A_c}{2}(\cos(\omega_0(t) + \varphi(t) + \vartheta(t))$$

$$s_2(t) = \frac{A_c}{2}(\cos(\omega_0(t) + \varphi(t) - \vartheta(t))$$

wherein the amplitude, $A_c$, and phase, θ(t), are functions of the power level, $P_T$, and of A(t), respectively. For example, in some LINC schemes, the two constant envelope signals may be generated by selecting $A_c$ and θ(t) as follows:

$$A_c = k > \max\left(\sqrt{P_T} A(t)\right) \text{ and } \vartheta(t) = \cos^{-1}\left(\frac{\sqrt{P_T} A(t)}{k}\right)$$

Although the amplitude $A_c$ and phase θ(t) of the constant envelope signals may be calculated according to the theoretical method described above, other methods, for example, empirical methods may be used to separate the input signal S(t) into two separate constant envelope signals. Such empirical methods may be devised according to the specific LINC scheme used in specific implementations of the present invention. For example, if desired, in some embodiments of the invention, an empirical method for separating the two envelope signals may be used in conjunction with a LINC scheme involving a reactive termination combiner. Although the scope of the present invention is not limited in this respect, separator 212 may provide sigma-delta modulators 216 and 218 with digital signals 214, 215, respectively.

Although the scope of the present invention is not limited in this respect, in this exemplary embodiment of the present invention, sigma-delta modulators 216 and 218 and separator 212 may be implemented by software within DSP 210. However, in alternative embodiments of the present invention, sigma-delta modulators 216 and 218 and separator 212 may be implemented by hardware and/or by any suitable combination of hardware and software, and the like.

Although the scope of the present invention is not limited in this respect, an offset signal 202 that may be related to a desired power level of the transmitted signal may be input to sigma-delta modulators 216 and 218. Sigma delta modulators 216, 218 may combine signal 202 with signals 214 and 215 to provide control signals 223, 225 to synthesizers 230, 240, respectively. For example, control signals 223, 225 may include digital words of one or more bits based on the implementation needs of different embodiments of the present invention.

Although the scope of the present invention is not limited in this respect, sigma-delta modulators 216, 218 may modulate an instantaneous frequency of synthesizers 230, 240, respectively, based on a desired power level of a transmitted frequency. Synthesizers 230 and 240 may be fractional-N synthesizers, if desired. Reference oscillator 220 may provide a reference signal to synthesizers 230, 240. Synthesizers 230, 240 may modulate portions of signal 201 based on control signals 223, 225, respectively, and may generate respective phase shifted, adjusted, radio frequency (RF) signals, 233 and 243. Synthesizers 230, 240 may provide the RF signals 233 and 243 to power amplifiers 250, 260, respectively. For example, power amplifiers (PA) 250, 260 may be saturated PA's, if desired.

Although the scope of the present invention is not limited in this respect, transmitter 200 may include feedback loops 280 and 290 to extract feedback signals 253 and 263 from the outputs of power amplifiers 250,260, respectively, and provide them to dividers 234 and 244, respectively. Phase Detectors (PD) 232 and 242 that may be positioned downstream from dividers 234 and 244 in feedback loops 280 and 290, respectively, may detect phase shifts caused by PAs 250 and 260, which may be reflected in signals 253 and 263, respectively, and/or any other delays or mismatches that may be caused by various other components of the transmitter. Loop filters 236 and 246 that may optionally follow the PD's 232 and 242 in loops 280 and 290, respectively, may be used to remove the phase shifts detected by PD's 232 and 242. In this exemplary embodiment of the invention, the feedback signals 253 and 263 may be used to remove phase shifts generated by amplifiers 250 and 260, respectively, thereby reducing the phase misalignment between the two modulated output signals 254 and 264.

It will be appreciated that in other embodiments of the invention, other type of synthesizers may replace synthesizers 230 and 240, e.g., direct digital synthesizers (DDS), PLL synthesizers and/or other phase modulated synthesizers. In such and other embodiments, feedback loops may be adapted accordingly to provide such synthesizers with signals responsive to detected phase shifts caused by amplifiers positioned downstream from the synthesizers, so that the synthesizers may be able to remove these phase shifts.

Combiner 270, for example, a reactive termination combiner, a transmission line combiner, a Wilkinson combiner, a transformer combiner, and the like, may reconstruct a RF signal from modulated output signals 254 and 264 to provide a transmitted signal with a desired power level.

Figure 3:
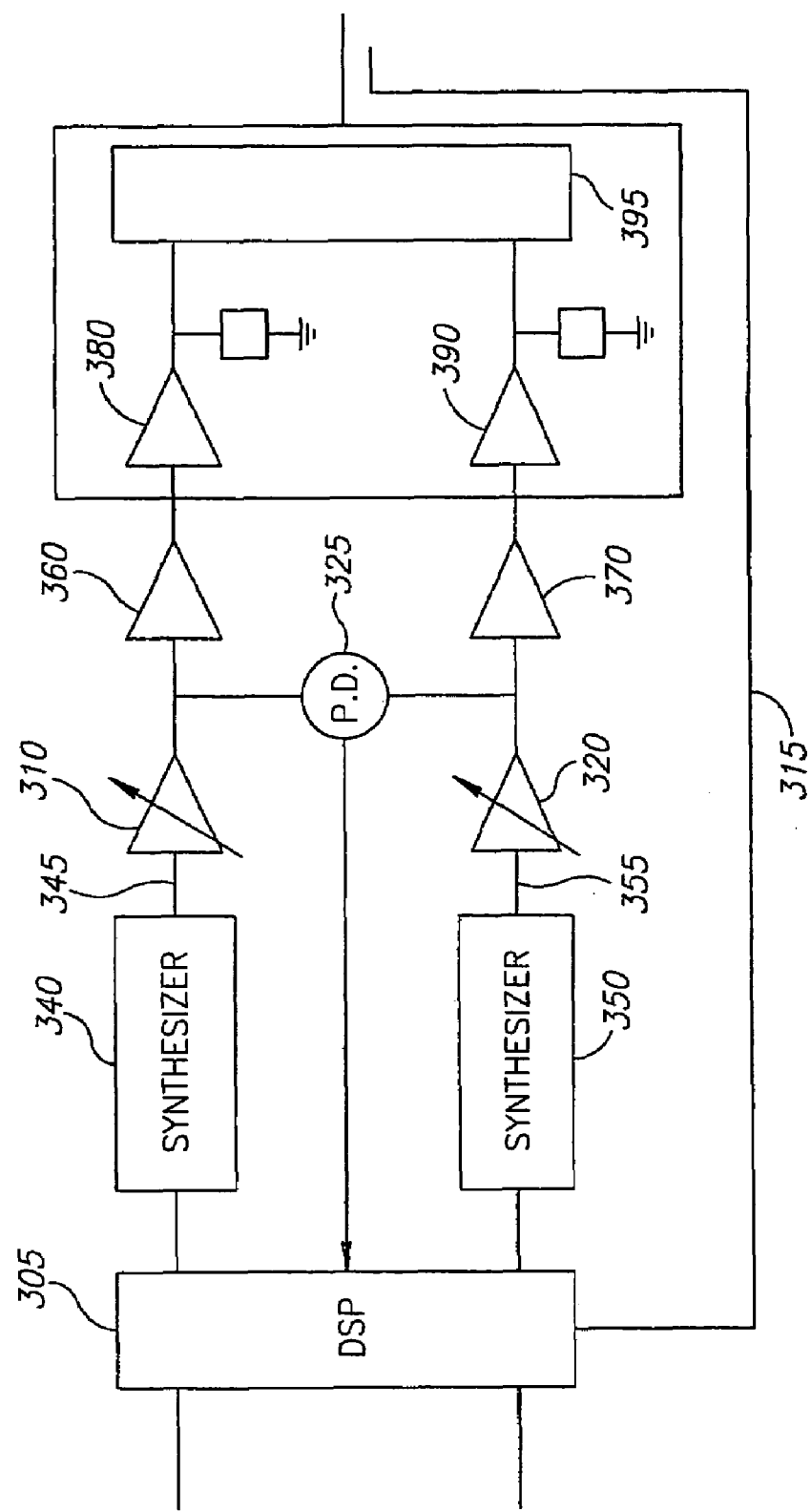
FIG. 3 is a block diagram of a transmitter according to another exemplary embodiment of the present invention.

Turning to FIG. 3, a block diagram of a transmitter 300 according to another exemplary embodiment of the present invention is shown. Although the scope of the present invention is not limited in this respect, the architecture and operation of transmitter 300 may be generally similar to those of transmitter 200 (FIG. 2), except for the differences described below. A digital signal processor (DSP) 305 may generate, based on an input signal (not shown in the drawings), two separate constant envelope signals, e.g., as described above. The separate signals may be fed through two separate modulation paths, 306 and 307, starting with synthesizers 340 and 350, respectively, which may include two respective RF amplification paths having one or more amplification components. For example, although the scope of the present invention is not limited in this respect, in the exemplary embodiment shown in FIG. 3, modulation paths 306 and 307 may be associated with synthesizers 340 and 350, respectively, variable gain amplifiers 310 and 320, respectively, PA's 360 and 370, respectively, and branch amplifiers 380 and 390, respectively. The outputs from modulation paths 306 and 307 at branch amplifiers 380 and 390, respectively, may be combined in a reactive termination combiner 395.

In this example, DSP 305 may control the modulation of synthesizers 340, 350 and the gains of amplifiers 310, 320. However, in alternative embodiments of the invention, other processors or controllers may adjust the gains of amplifiers 310, 320, thereby to adjust the amplitudes of the outphased modulated signals 345, 355, respectively. The adjustment may be based on a desired power level, if desired.

Although the scope of the present invention is not limited in this respect, transmitter 300 may include a phase detector (PD) 325 that may be associated with modulation paths 306 and 307 of the separated signals to provide feedback to DSP 305. Although the scope of the present invention is not limited in this respect, in the specific exemplary embodiment shown in FIG. 3, PD 325 may detect phase differences between the signals output from amplifiers 310 and 320. In other exemplary embodiments of this invention, PD 325 may be positioned to receive an input from other points along the modulation paths, e.g., downstream from amplifiers 350 and 360 and/or downstream from amplifiers 380 and 390, so that PD 325 may detect phase differences between signals passing at those alternative points. PD 325 may input the detected phase differences to DSP 305. Based on a value responsive to the detected phase differences, for example, based on an averaged value of the detected phase differences, DSP 305 may adapt a compensating phase shift between the two signals input to synthesizers 340 and 350, respectively. The compensating phase shift may reduce the phase difference that may be detected by PD 325 further downstream on the modulation paths.

Although the scope of the present invention is not limited in this respect, phase detector 325 may include a XOR or NOR gate, as are known in the art.

Although the scope of the present invention is not limited in this respect, synthesizers 340, 350 may include fractional-N synthesizers, direct digital synthesizers (DDS), PLL synthesizers and/or other phase modulated synthesizers as are known in the art.

Although the scope of the present invention is not limited in this respect, in alternative embodiments of the present invention, transmitter 300 may include an additional feedback loop, for example, a feedback signal 315 may be provided from an output signal of reactive termination combiner 395 to DSP 305, if desired. This feedback signal may be used to improve linearity of the amplification process through the transmitter, as is known in the art.

Some embodiments of the invention may be implemented, for example using a machine-readable medium or article which may store an instruction or a set of instructions that, if executed by a machine (for example, by station 110, and/or by other suitable machines), cause the machine to perform a method and/or operations in accordance with embodiments of the invention. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.g., C, C++, Java, BASIC, Pascal, Fortran, Cobol, assembly language, machine code, or the like.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus comprising:
    a phase alignment configuration able to align phases of first and second outphased signals generated by first and second modulation paths, respectively, based on first and second phases of first and second feedback signals from downstream of first and second synthesizers, respectively, on said first and second modulation paths, respectively; and
    a digital signal processor to receive one or more signals responsive to said first and second feedback signals, to provide first and second digitally-processed signals to said first and second synthesizers, respectively, and to remove a phase shift between said first and second outphased signals,
    wherein said phase alignment configuration comprises: a phase detector able to detect a phase shift between said first and second feedback signals, and to provide to said digital signal processor a signal responsive to said detected phase shift.

2. The apparatus of claim 1 wherein the first and second synthesizers comprise first and second fractional-N synthesizers, respectively.

3. The apparatus of claim 1 further comprising:
a combiner to combine the outputs of said first and second modulation paths into a radio frequency transmission signal.

4. The apparatus of claim 3 wherein the combiner comprises a reactive termination combiner.

5. The apparatus of claim 1, wherein the first and second modulation paths comprise first and second radio frequency amplification paths, respectively, to amplify said first and second outphased signals, respectively.

6. The apparatus of claim 5 wherein at least one of said first and second feedback signals is extracted from at least one respective predetermined point along at least one of said first and second radio frequency amplification paths.

7. The apparatus of claim 6 wherein said first and second synthesizers are able to compensate for phase shifts caused by said first and second amplification paths, respectively, based at least in part on said feedback signals.

8. A method comprising:
aligning phases of first and second synthesized outphased signals based on first and second phases of first and second feedback signals responsive to said first and second outphased signals, respectively; and
amplifying said first and second synthesized outphased signals via first and second amplification paths, respectively, to provide first and second amplified signals, respectively;
wherein said first and second feedback signals comprise first and second feedback signals responsive to said first and second amplified signals, respectively and wherein aligning comprises:
detecting first and second phase shifts, caused by amplifying said first and second synthesized outphased signals, respectively, by comparing said first and second feedback signals to said first and second synthesized outphased signals, respectively; and
filtering out said phase shifts.

9. The method of claim 8, wherein said synthesized outphased signals comprise N-fractionally synthesized outphased signals.

10. The method of claim 8 further comprising:
combining said first and second amplified signals into a radio frequency transmission signal.

11. The method of claim 8, wherein aligning comprises:
detecting a phase shift between said first and second feedback signals; and
removing said phase shift by synthesizing said first and second outphased signals based on said detected phase shift.

12. A wireless communication device comprising:
a transmitter comprising first and second modulation paths including first and second synthesizers, respectively, wherein said transmitter is able to align phases of first and second outphased signals generated by said first and second modulation paths, respectively, based on first and second phases of first and second feedback signals from downstream of said first and second synthesizers, respectively, wherein the first and second modulation paths comprise first and second radio frequency amplification paths, respectively, to amplify said first and second outphased signals, respectively, and at least one of said first and second feedback is extracted from at least one respective predetermined point along at least one of said first and second radio frequency amplification paths; and
a dipole antenna to transmit an output signal of said transmitter,
wherein said transmitter further comprises:
a phase detector able to detect a phase shift, between said first and second feedback signals, and able to provide a phase signal responsive to said detected phase shift;
a digital signal processor to receive said phase signal, to provide digitally processed signals to said first and second synthesizers, and to remove the phase shift detected by said phase detector, based at least in part on said phase signal.

13. The wireless communication device of claim 12, wherein said first and second synthesizers are able to compensate for phase shifts caused by said first and second amplification paths, respectively, based at least in part on said feedback signals.

14. A wireless communication system comprising:
a first communication station comprising:
a transmitter comprising first and second modulation paths including first and second synthesizers, respectively, wherein said transmitter is able to align phases of first and second outphased signals, generated by said first and second modulation paths, respectively, based on first and second phases of first and second feedback signals from downstream of said first and second synthesizers, respectively, wherein at least one of said first and second feedback signals is extracted from at least one respective predetermined point along at least one of said first and second paths;
wherein said transmitter further comprises a phase detector able to detect a phase shift between said first and second feedback signals, and provide a phase signal responsive to said detected phase shift; and a digital signal processor to receive said phase signal to provide digitally processed signals to said first and second synthesizers, and to remove the phase shift detected by said phase detector, based at least in part on said phase signal; and
a second communication station capable of receiving a signal transmitted by said first communication station.

15. The wireless communication system of claim 14, wherein said first and second modulation paths comprise first and second radio frequency amplification paths, respectively, to amplify said first and second outphased signals, respectively, and wherein said first and second synthesizers are able to compensate for phase shifts caused by said fast and second amplification paths, respectively, based at least in part on said feedback signals.

16. A machine-readable medium having stored thereon instruction, which when executed by a computing platform result in:
aligning phases of first and second synthesized outphased signals based on first and second phases of first and second feedback signals responsive to said first and second outphased signals, respectively;
amplifying said first and second synthesized outphased signals via first and second amplification paths, respectively, to provide first and second amplified signals respectively, said first and second feedback signals comprising first and second feedback signals responsive to said first and second amplified signals, respectively; and
combining said first and second amplified signals into a desired radio frequency transmission signal,
wherein the instructions resulting in aligning phases of first and second synthesized outphased signals results in:
detecting first and second phase shifts, caused by amplifying said first and second synthesized outphased signals, respectively, by comparing said first and second feedback signals to said first and second synthesized outphased signals, respectively; and filtering out said phase shifts.

17. The machine-readable medium of claim 16, wherein the instructions resulting in aligning phases of first and second synthesized outphased signals results in:

detecting a phase shift between said first and second feedback signals; and removing said phase shift by synthesizing said first and second outphased signals based on said detected phase shift.

* * * * *